(12) United States Patent
Hsu et al.

(10) Patent No.: US 11,997,798 B2
(45) Date of Patent: May 28, 2024

(54) PACKAGE SUBSTRATE AND METHOD FOR MANUFACTURING THE SAME

(71) Applicant: Advanced Semiconductor Engineering, Inc., Kaohsiung (TW)

(72) Inventors: Wu Chou Hsu, Kaohsiung (TW); Hsing Kuo Tien, Kaohsiung (TW); Chih-Cheng Lee, Kaohsiung (TW); Min-Yao Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/899,553

(22) Filed: Aug. 30, 2022

(65) Prior Publication Data
US 2022/0418115 A1    Dec. 29, 2022

Related U.S. Application Data

(63) Continuation of application No. 17/025,939, filed on Sep. 18, 2020, now Pat. No. 11,432,406.

(51) Int. Cl.
*H05K 1/02* (2006.01)
*H01L 21/48* (2006.01)
(Continued)

(52) U.S. Cl.
CPC ........... *H05K 3/30* (2013.01); *H01L 21/4857* (2013.01); *H01L 23/49822* (2013.01);
(Continued)

(58) Field of Classification Search
CPC ........ H05K 1/02; H05K 1/0266; H05K 1/183; H05K 3/30; H05K 2201/1003; H05K 2203/166; H05K 2223/54426; H01L 21/565; H01L 21/4853; H01L 21/4857; H01L 23/10; H01L 23/345; H01L 23/544; H01L 23/645; H01L 23/3121; H01L 23/3128; H01L 23/5383; H01L 23/5386; H01L 23/49822; H01L 23/49827; H01L 25/16; H01L 25/18; H01L 2224/821; H01L 2224/01033; H01L 2224/12105; H01L 2224/16227; H01L 2224/24146;
(Continued)

(56) References Cited

U.S. PATENT DOCUMENTS 9,502,953 B2  11/2016  Ida et al.
2007/0172991 A1  7/2007  Schaadt
(Continued)

OTHER PUBLICATIONS

Non-Final Office Action for U.S. Appl. No. 17/025,939, dated Jan. 20, 2022, 10 pages.
(Continued)

*Primary Examiner* — Xiaoliang Chen
(74) *Attorney, Agent, or Firm* — FOLEY & LARDNER LLP

(57) ABSTRACT

A package substrate and manufacturing method thereof are provided. The package substrate includes a substrate and an electronic component. The substrate includes a cavity. The electronic component is disposed in the cavity. The electronic component includes a first region and a second region, and an optical recognition rate of the first region is distinct from that of the second region.

19 Claims, 22 Drawing Sheets

(51) Int. Cl.
*H01L 23/10* (2006.01)
*H01L 23/498* (2006.01)
*H01L 23/544* (2006.01)
*H01L 25/16* (2023.01)
*H01L 25/18* (2023.01)
*H05K 1/18* (2006.01)
*H05K 3/30* (2006.01)

(52) U.S. Cl.
CPC ...... *H01L 23/49827* (2013.01); *H01L 23/544* (2013.01); *H05K 1/0266* (2013.01); *H05K 1/183* (2013.01); *H01L 2223/54426* (2013.01); *H05K 2201/1003* (2013.01); *H05K 2203/166* (2013.01)

(58) Field of Classification Search
CPC ..... H01L 2224/24226; H01L 2924/014; H01L 2924/14; H01L 2924/01033; H01L 2924/01078; H01L 2924/15311; H01L 2924/18161; H01L 2924/19024; H01L 2924/19103; H01L 2924/19106; H01L 2924/73204; H01L 2924/92125
USPC ............ 174/260; 257/737; 310/28; 438/123, 438/127
See application file for complete search history.

(56) References Cited

U.S. PATENT DOCUMENTS

| 2008/0151353 | A1 | 6/2008 | Haskett | |
|---|---|---|---|---|
| 2009/0029185 | A1 | 1/2009 | Lee et al. | |
| 2011/0084382 | A1* | 4/2011 | Chen | H01L 23/544 257/737 |
| 2011/0122408 | A1 | 5/2011 | Shibayama et al. | |
| 2013/0135317 | A1 | 5/2013 | Shenoy | |
| 2013/0313920 | A1* | 11/2013 | Ida | H02K 41/031 310/28 |
| 2021/0391283 | A1* | 12/2021 | Hsu | H01L 21/4857 |
| 2021/0391284 | A1* | 12/2021 | Hsu | H01L 23/5383 |

OTHER PUBLICATIONS

Notice of Allowance for U.S. Appl. No. 17/025,939, dated Apr. 28, 2022, 9 pages.

* cited by examiner

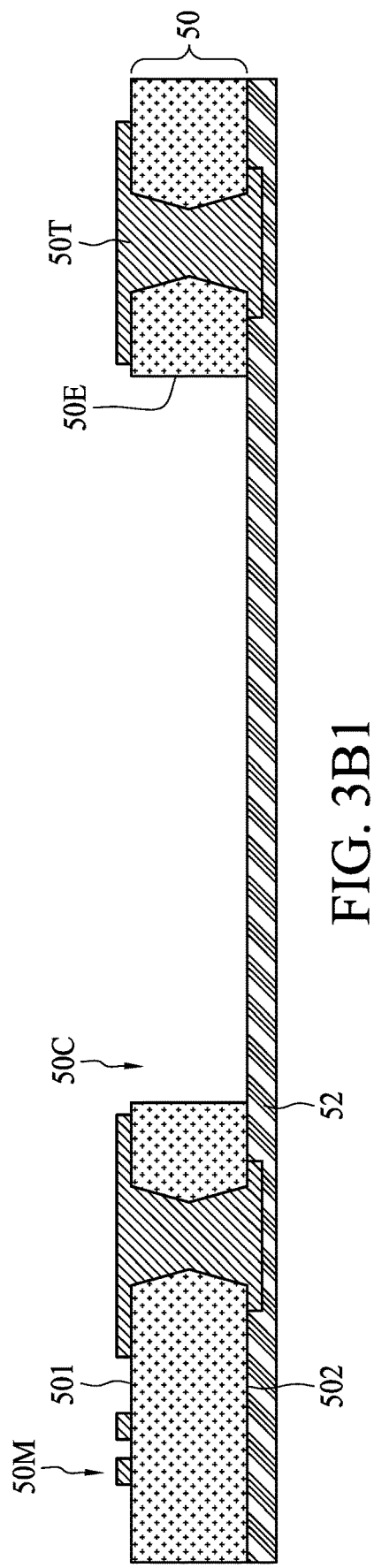
FIG. 3B1

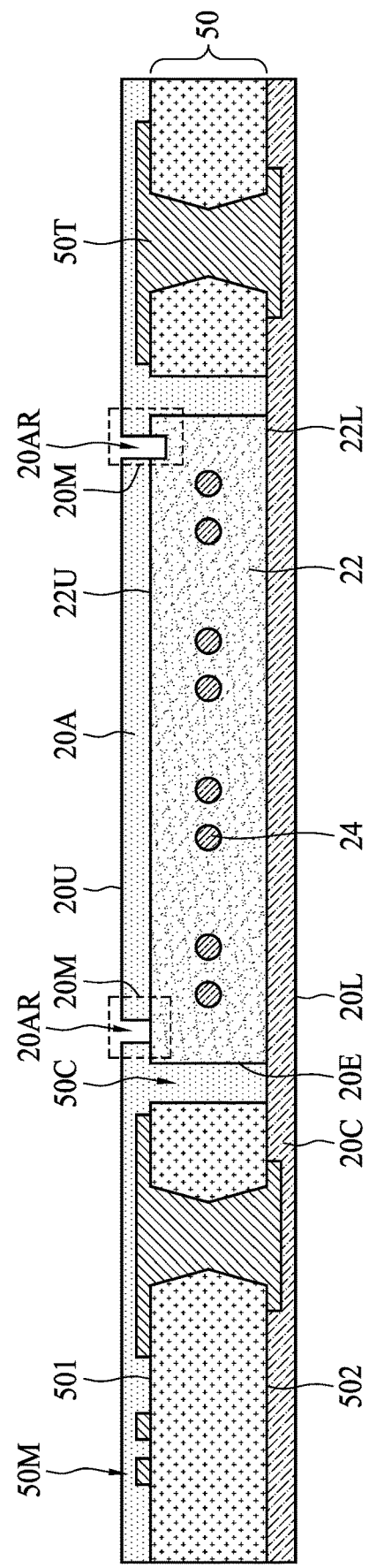
FIG. 3F1

PACKAGE SUBSTRATE AND METHOD FOR MANUFACTURING THE SAME

CROSS-REFERENCE TO RELATED APPLICATION

This application is a continuation of U.S. patent application Ser. No. 17/025,939 filed Sep. 18, 2020, now issued as U.S. Pat. No. 11,432,406, the contents of which is incorporated herein by reference in its entirety.

BACKGROUND

1. Technical Field

The present disclosure relates to a package substrate and manufacturing method thereof, and more particularly, to a package substrate with embedded electronic component and manufacturing method thereof.

2. Description of the Related Art

As multiple functions and high performance have become typical requirements of consumer electronic and communication products such as smart phones, electronic device packages are expected to possess superior electrical properties, low power consumption and a large number of I/O ports. In order to achieve multiple function and high performance, the electronic device packages are equipped with more active components and passive components. The active components and passive components, however, increase the overall thickness of the electronic device package. It is therefore desirable to develop a package substrate with thin thickness, multiple functions, high performance and low power consumption to meet the compactness requirement of consumer electronic and communication products.

SUMMARY

One aspect of the present disclosure relates to a method of processing an electronic component. In some embodiments, the method includes the following operations. A temporary substrate is provided. The temporary substrate includes a cavity and a fiducial mark on a first surface of the temporary substrate. An electronic component is disposed in the cavity of the temporary substrate. A first passivation layer is formed in the cavity and covering a first surface of the electronic component. A location of a reference alignment mark in the first passivation layer is determined using the fiducial mark of the temporary substrate, and the reference alignment mark is formed in the first passivation layer.

Another aspect of the present disclosure relates to a method of manufacturing a package substrate. In some embodiments, the method includes the following operations. At least one electronic component including a reference alignment mark is provided. The electronic component is disposed in a cavity of a substrate, and a location of the electronic component in the cavity is determined by aligning the reference alignment mark of the electronic component with the substrate. A first dielectric layer is formed in the cavity and covering a first surface of the electronic component. A plurality of first perforations is formed in the first dielectric layer to partially expose conductive wires of the electronic component. A plurality of first conductive traces are formed in the first perforations to electrically connect the conductive wires exposed through the first perforations.

Another aspect of the present disclosure relates to a package substrate. In some embodiments, the package substrate includes a substrate and an electronic component. The substrate includes a cavity. The electronic component is disposed in the cavity. The electronic component includes a first region and a second region, and an optical recognition rate of the first region is distinct from that of the second region.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

FIG. 3A, FIG. 3B, FIG. 3B1, FIG. 3C, FIG. 3D, FIG. 3E, FIG. 3F, FIG. 3F1, FIG. 3G and FIG. 3H illustrate operations of processing an electronic component in accordance with some embodiments of the present disclosure.

DETAILED DESCRIPTION

Figure 1:
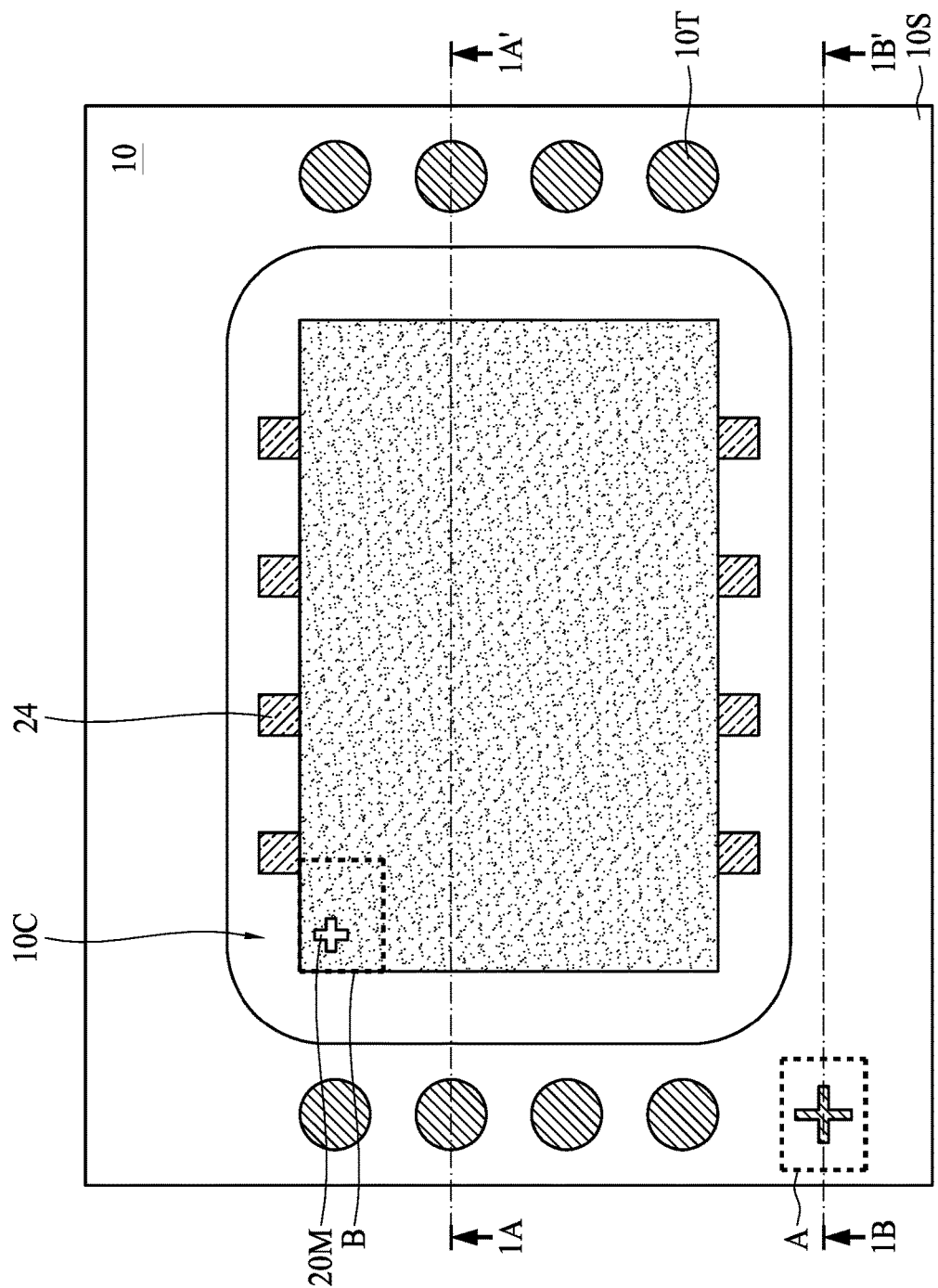
FIG. 1 is a schematic top view of a package substrate in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1A:
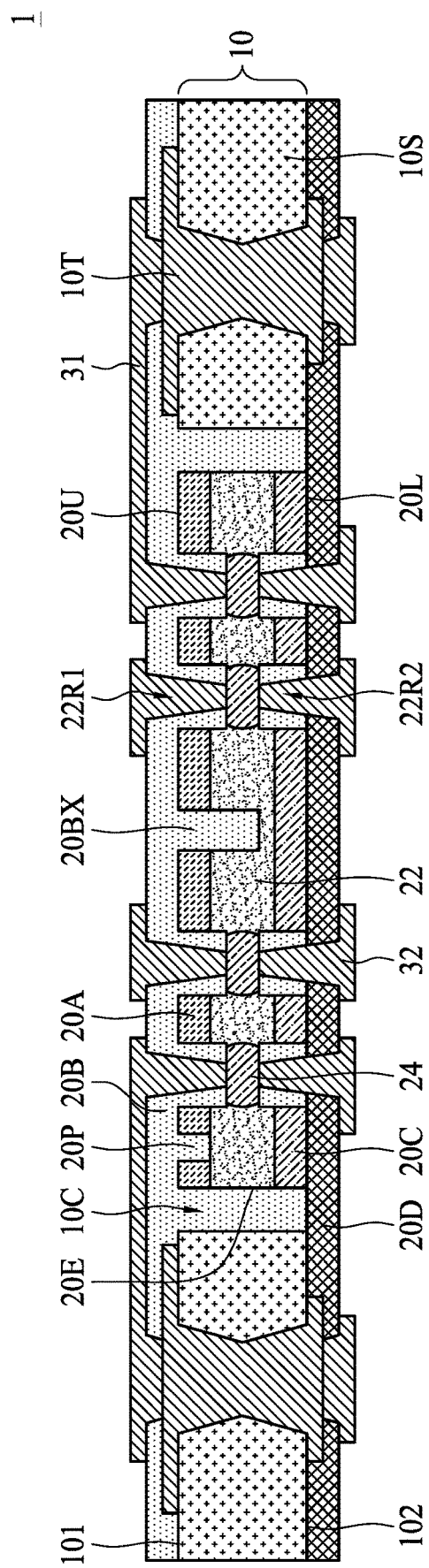
FIG. 1A is a cross-sectional view of the package substrate along a line 1A-1A' of FIG. 1.
Figure 1B:
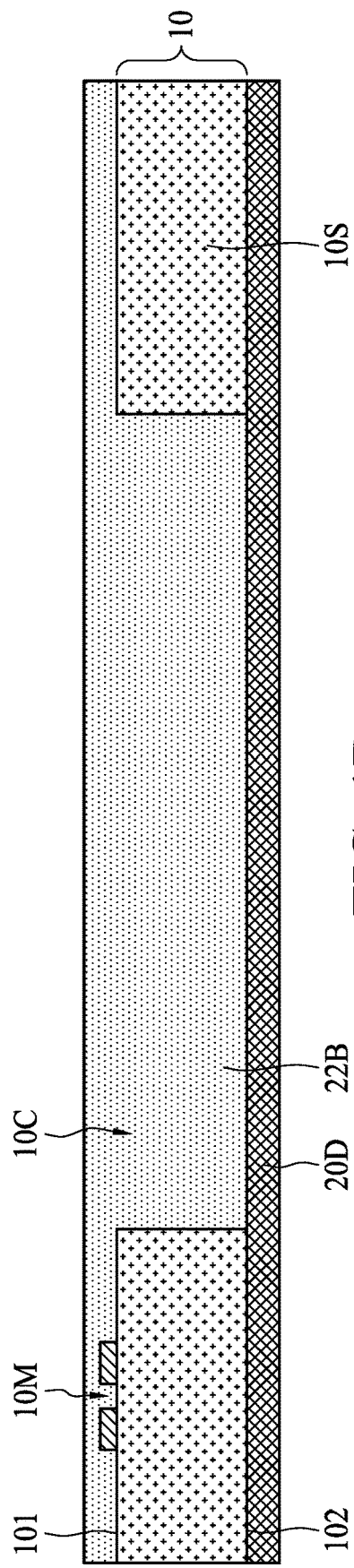
FIG. 1B is a cross-sectional view of the package substrate along a line 1B-1B' of FIG. 1.
Figure 1C:
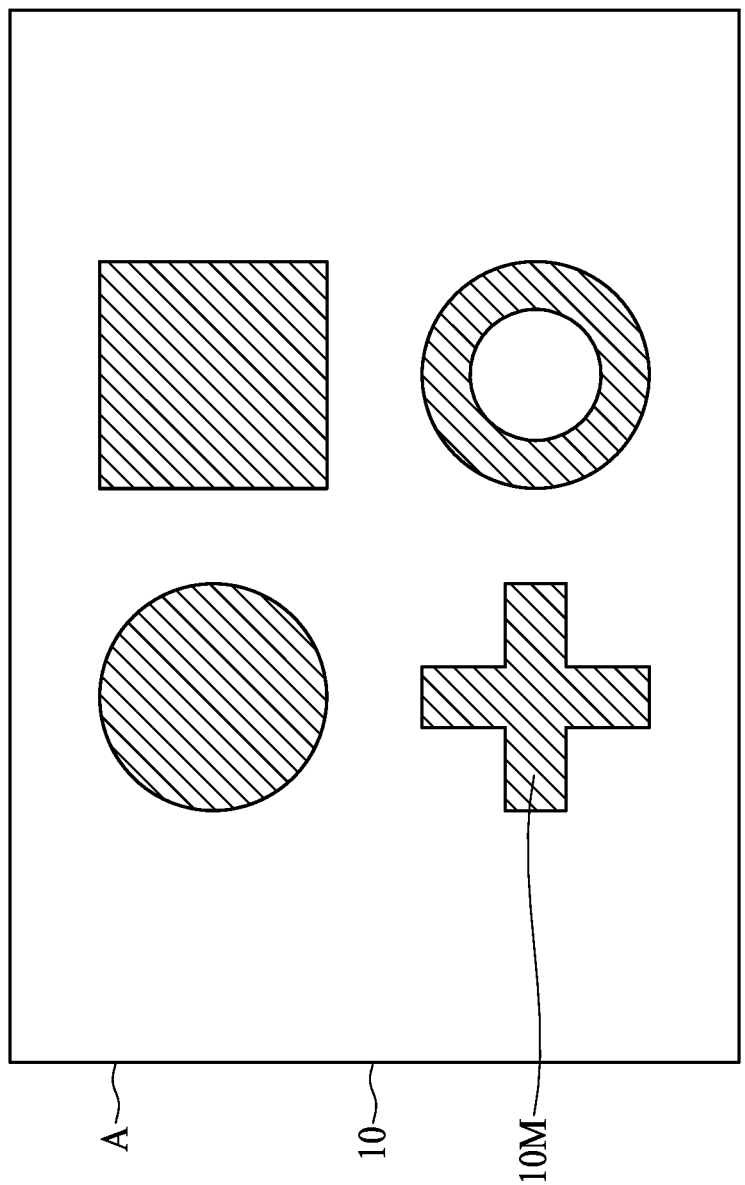
FIG. 1C is an enlarged view of a region "A" of FIG. 1.
Figure 1D:
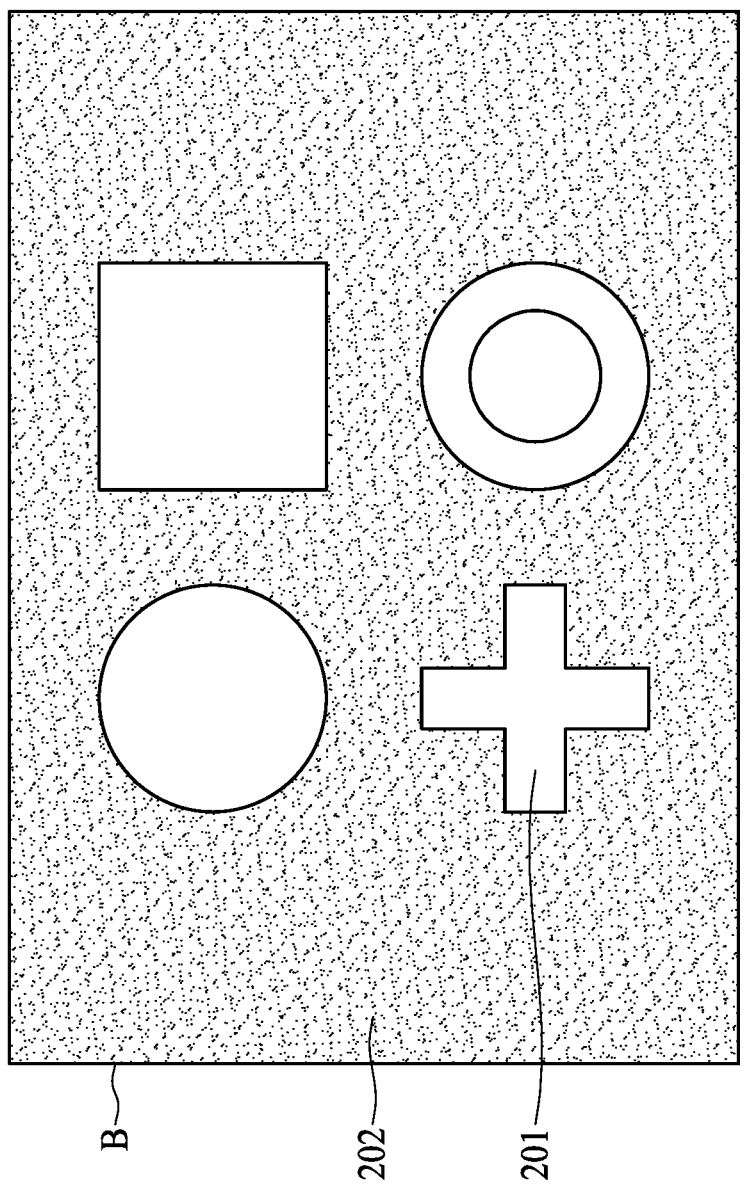
FIG. 1D is an enlarged view of a region "B" of FIG. 1.

FIG. 1 is a schematic top view of a package substrate 1 in accordance with some embodiments of the present disclosure, FIG. 1A is a cross-sectional view of the package substrate 1 along a line 1A-1A' of FIG. 1, FIG. 1B is a cross-sectional view of the package substrate 1 along a line 1B-1B' of FIG. 1, FIG. 1C is an enlarged view of a region "A" of FIG. 1, and FIG. 1D is an enlarged view of a region "B" of FIG. 1. To highlight features of the package substrate 1, some components such as dielectric layer and conductive trace are not drawn in FIG. 1. As shown in FIG. 1, FIG. 1A, FIG. 1B, FIG. 1C and FIG. 1D, the package substrate 1 includes a substrate 10 and an electronic component 20. The substrate 10 includes a first surface 101 and a second surface 102 opposite to the first surface 101. The substrate 10 may include a package substrate with circuitry therein. For example, the substrate 10 may include a core substrate, a core-less substrate or other types of substrates. The substrate 10 may include a supporting portion 10S defining one or more cavities 10C for accommodating the electronic component 20. In some embodiments, the cavity 10C may, but is not limited to, penetrate through the substrate 10. In some embodiments, the material of the supporting portion 10S is relatively firm. By way of example, the material of the supporting portion 10S may include polypropylene (PP) or other suitable dielectric or insulative materials. The substrate 10 may include a plurality of conductive structures 10T such as conductive vias extending from the first surface 101 to the second surface 102 of the substrate 10 to electrically connect electronic components and/or semiconductor die disposed on the first surface 101 and the second surface 102. For example, the conductive structures 10T may include copper or other suitable conductive material. In some embodiments, the cross-sectional shape of the conductive structure 10T may include, but is not limited to, an X shape or an hourglass shape. In some other embodiments, the cross-sectional shape of the conductive structure 10T may include rectangular shape, trapezoid shape or other suitable shapes.

As shown in FIG. 1B, the substrate 10 may include one or more fiducial mark 10M disposed on the first surface 101 and/or the second surface 102. The fiducial mark 10M may be configured as an alignment mark when disposing the electronic component 20. As shown in FIG. 1C, the fiducial mark 10M may include a cross shape pattern, a circular shape pattern, a rectangular shape pattern, a ring shape pattern or any other suitable pattern that is optically detectable.

The electronic component 20 is disposed in the cavity 10C of the substrate 10. The thickness of the electronic component 20 may be less than or substantially equal to that of the substrate 10 such that the installation of the electronic component 20 may not increase the overall thickness of the package substrate 1. In some embodiments, the electronic component 20 includes a magnetic layer 22 and one or more conductive wires 24. By way of examples, the electronic component 20 may include a passive component such as an inductor. The electronic component 20 includes a first surface 20U adjacent to the first surface 101 of the substrate 10, and a second surface 20L adjacent to the second surface 102 of the substrate. The magnetic layer 22 may include ferrite or other suitable magnetic materials. By way of example, the material of the magnetic layer 22 may include a compound of iron oxide and other components including one of magnesium (Mg), aluminum (Al), barium (Ba), manganese (Mn), copper (Cu), nickel (Ni), cobalt (Co) or the like. In some embodiments, the magnetic layer 22 is an opaque magnetic material, which is non-transparent to light. The magnetic layer 22 may be single-layered or multi-layered. The conductive wire 24 may include metal wire such as copper wire. In some embodiments, two ends of the conductive wire 24 may, but are not limited to, slightly protrude out the magnetic layer 22. In some other embodiments, two ends of the conductive wire 24 may be substantially coplanar with the magnetic layer 22 or covered by the magnetic layer 22. The magnetic layer 22 partially covers the conductive wire 24.

The electronic component 20 includes a first region 201 and a second region 202, and an optical recognition rate of the first region 201 is distinct from that of the second region 202. The first region 201 and the second region 202 of the electronic component 20 may be formed by stacking two or more structural layers of different materials and different patterns such that the optical recognition rate of the first region 201 is distinct from that of the second region 202 when viewing from the top of the electronic component 20. The distinct reflectivity of the first region 201 and the second region 202 can form a pattern such as a cross shape pattern, a circular shape pattern, a rectangular shape pattern, a ring shape pattern or any other suitable pattern that is optically detectable as shown in FIG. 1D. By way of examples, the electronic component 20 includes a stack of a first layer and a second layer disposed on an upper surface of the magnetic layer 22. In some embodiments, the first layer may include a passivation layer (also referred to as a first passivation layer) 20A, and the second layer may include a dielectric layer (also referred to as a first dielectric layer) 20B. The passivation layer 20A may include a recessed pattern or a protruding pattern configured as a reference alignment mark 20M during disposing the electronic component 20, and the dielectric layer 20B may be engaged with the passivation layer 20A. In some embodiments, the second layer may include a protrusion 20P inserted into the first layer and engaged with the reference alignment mark 20M of the electronic component 20. In some embodiments, the depth of the protrusion 20P may be less than the thickness of the first layer such that the protrusion 20P may not be in contact with the magnetic layer 22. In some embodiments, the depth of the protrusion 20P may be substantially equal to the thickness of the first layer such that the protrusion 20P may be in contact with the magnetic layer 22. In some other embodiments, the depth of the protrusion 20P may be larger than the thickness of the first layer such that the protrusion 20P may be further inserted into the magnetic layer 22.

The dielectric layer 20B may include a transparent dielectric material or a semi-transparent dielectric material, which is transparent or semi-transparent to light. By way of examples, the dielectric layer 20B may include a thermoplastic material such as Ajinomoto Build-up Film (ABF), Resin Coated Copper (RCC), Prepreg (PP), epoxy resin, or other suitable materials. The dielectric layer 20B can be further disposed in the cavity 10C, and disposed between edges 20E of the electronic component 20 and the supporting portion 10S of the substrate 10. In some embodiments, the dielectric layer 20B is configured to fix the electronic component 20 in the cavity 10C. The passivation layer 20A and the magnetic layer 22 may include one or more first recesses 22R1 partially exposing the conductive wires 24. In some embodiments, the conductive wire 24 exposed from the first recess 22R1 may include a non-circular cross-sectional shape such as a substantially flat surface. The dielectric layer 20B may be partially disposed in the first recess 22R1, and exposes the conductive wire 24.

The package substrate 1 may further include one or more first conductive traces 31 disposed in the first recesses 22R1 and electrically connected to the conductive wires 24. The first conductive trace 31 may be disposed on the dielectric layer 20B and filled in the first recess 22R1 to electrically connect the conductive wire 24. The first conductive trace 31 may further extend to the supporting portion 10S. In some embodiments, the conductive wire 24 may be configured as the coil of the inductor. In some embodiments, some of the conductive structures 10T may be electrically connected to the first conductive traces 31 as shown in FIG. 1A. In some other embodiments, some of the conductive structures 10T may be electrically disconnected from the first conductive traces 31.

In some embodiments, the dielectric layer 20B may further include a protruding portion 20BX inserted into the magnetic layer 22 between adjacent conductive wires 24 as shown in FIG. 1A. The protruding portion 20BX is able to divide the electronic component 20 into two or more inductive regions, and the dimension including width, length and depth of the protruding portion 40X may be modified to adjust the inductance of the electronic component 20.

In some embodiments, the electronic component 20 may further include a stack of another passivation layer (also referred to as a second passivation layer) 20C and another dielectric layer (also referred to as a second dielectric layer) 20D disposed on a lower surface of the magnetic layer 22. In some embodiments, the material of the passivation layer 20C may, but is not limited to, be the same as that of the firth layer 20A, and the material of the dielectric layer 20D may, but is not limited to, be the same as that of the dielectric layer 20B. In some embodiments, the stack of the passivation layer 20C and the dielectric layer 20D may be patterned and configured as another alignment mark of the electronic component 20.

In some embodiments, the passivation layer 20C and the magnetic layer 22 may include one or more second recesses 22R2 partially exposing the conductive wires 24. In some embodiments, the conductive wire 24 exposed from the second recess 22R2 may include a non-circular cross-sectional shape such as a substantially flat surface.

The package substrate 1 may further include a second conductive trace 32 in the second recess 22R2 and electrically connected to the conductive wire 24. In some embodiments, some of the conductive structures 10T may be electrically connected to the second conductive traces 32. In some other embodiments, some of the conductive structures 10T may be electrically disconnected from the second conductive traces 32.

In some embodiments of the present disclosure, the electronic component 20 includes a reference alignment mark 20M which is formed prior to the electronic component 20 is disposed in the cavity 10C of the substrate 10, and the alignment mark of the electronic component 20 can be used to align with the fiducial mark 10M of the substrate 10. Accordingly, the electronic component 20 can be accurately aligned with respect to the substrate 10 in the cavity 10C.

The package substrates and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Figure 2:
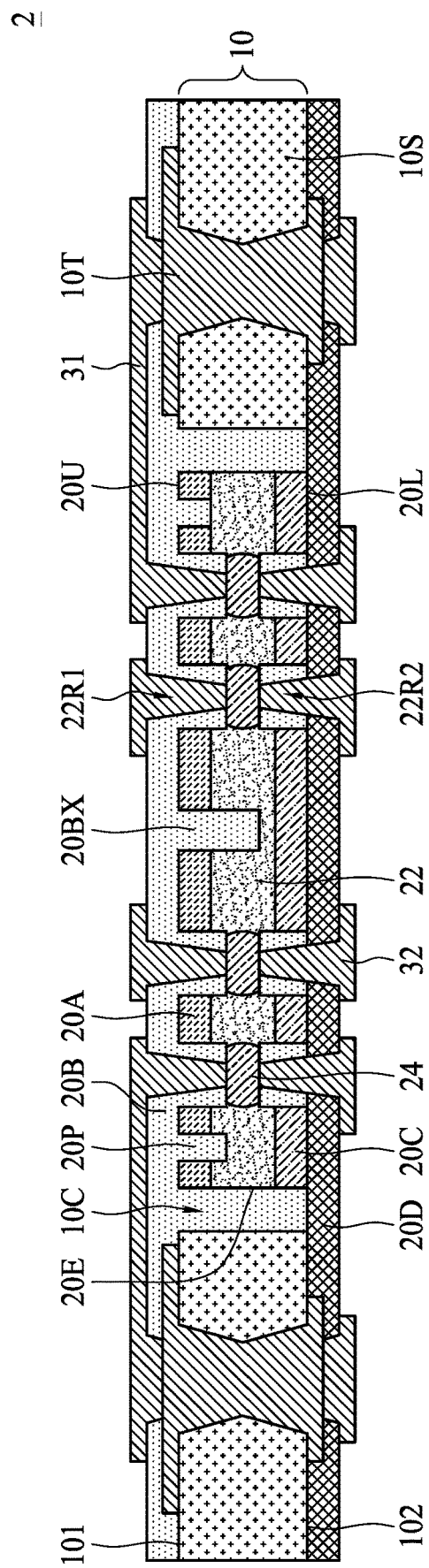
FIG. 2 is a schematic top view of a package substrate in accordance with some embodiments of the present disclosure.

FIG. 2 is a schematic top view of a package substrate 2 in accordance with some embodiments of the present disclosure. As shown in FIG. 2, in contrast to the package substrate 1 of FIG. 1A, the depth of the protrusion 20P of the dielectric layer 20B may be larger than the thickness of the passivation layer 20A such that the protrusion 20P may be further inserted into the magnetic layer 22.

Figure 3A:
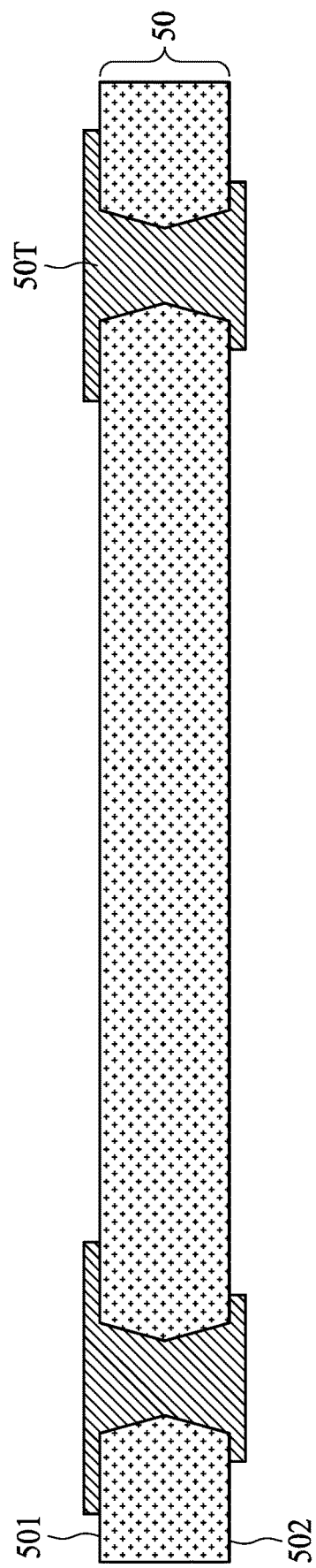
Figure 3B:
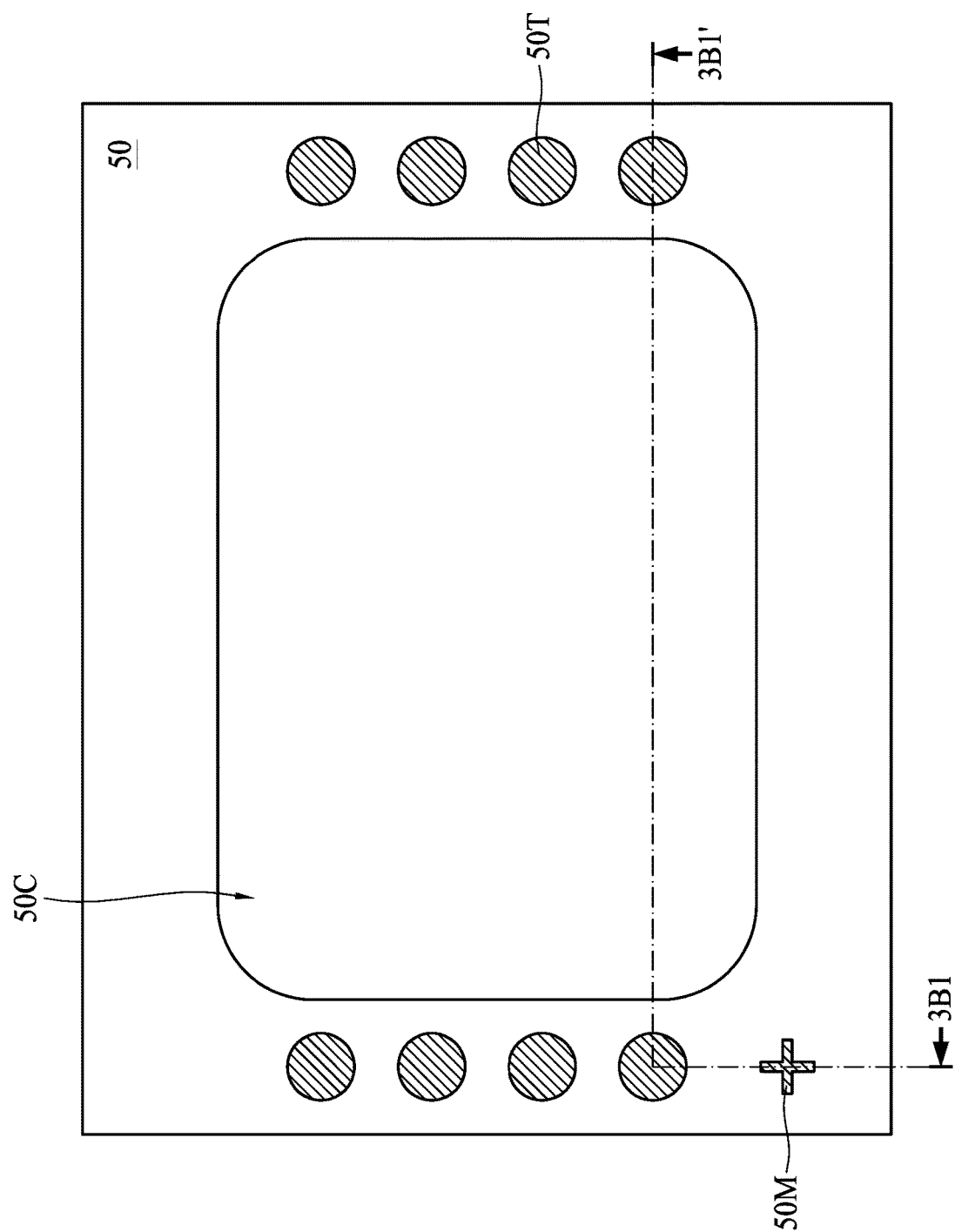
Figure 3C:
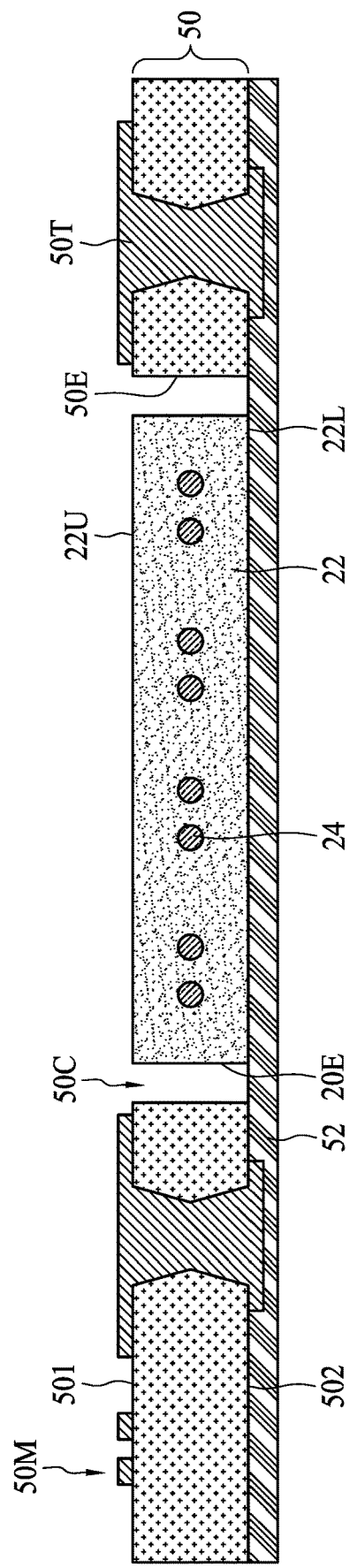
Figure 3D:
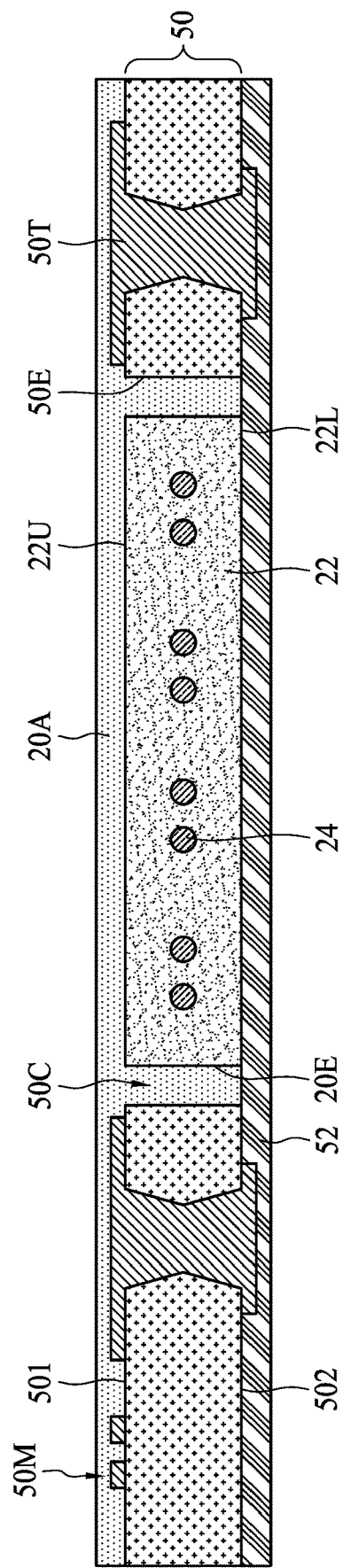
Figure 3E:
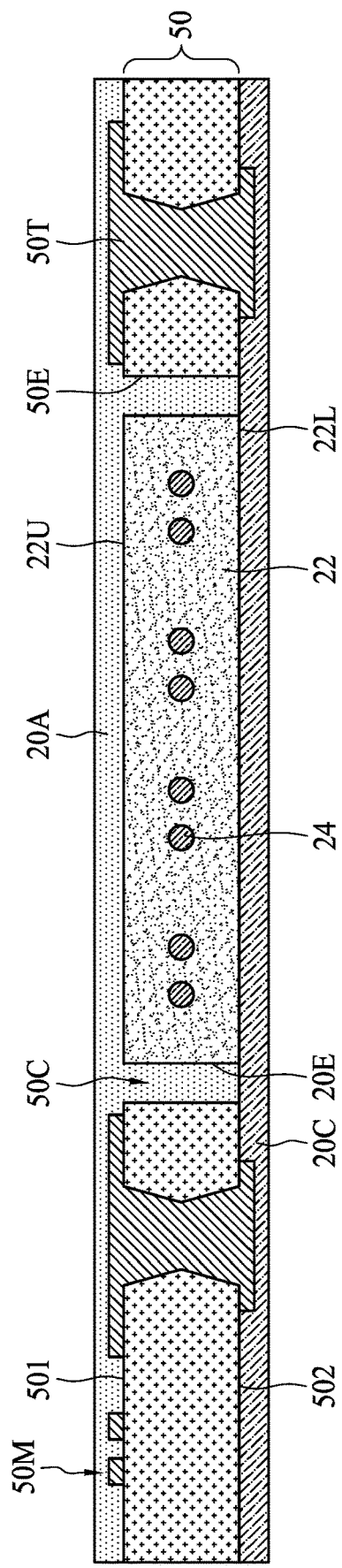
Figure 3F:
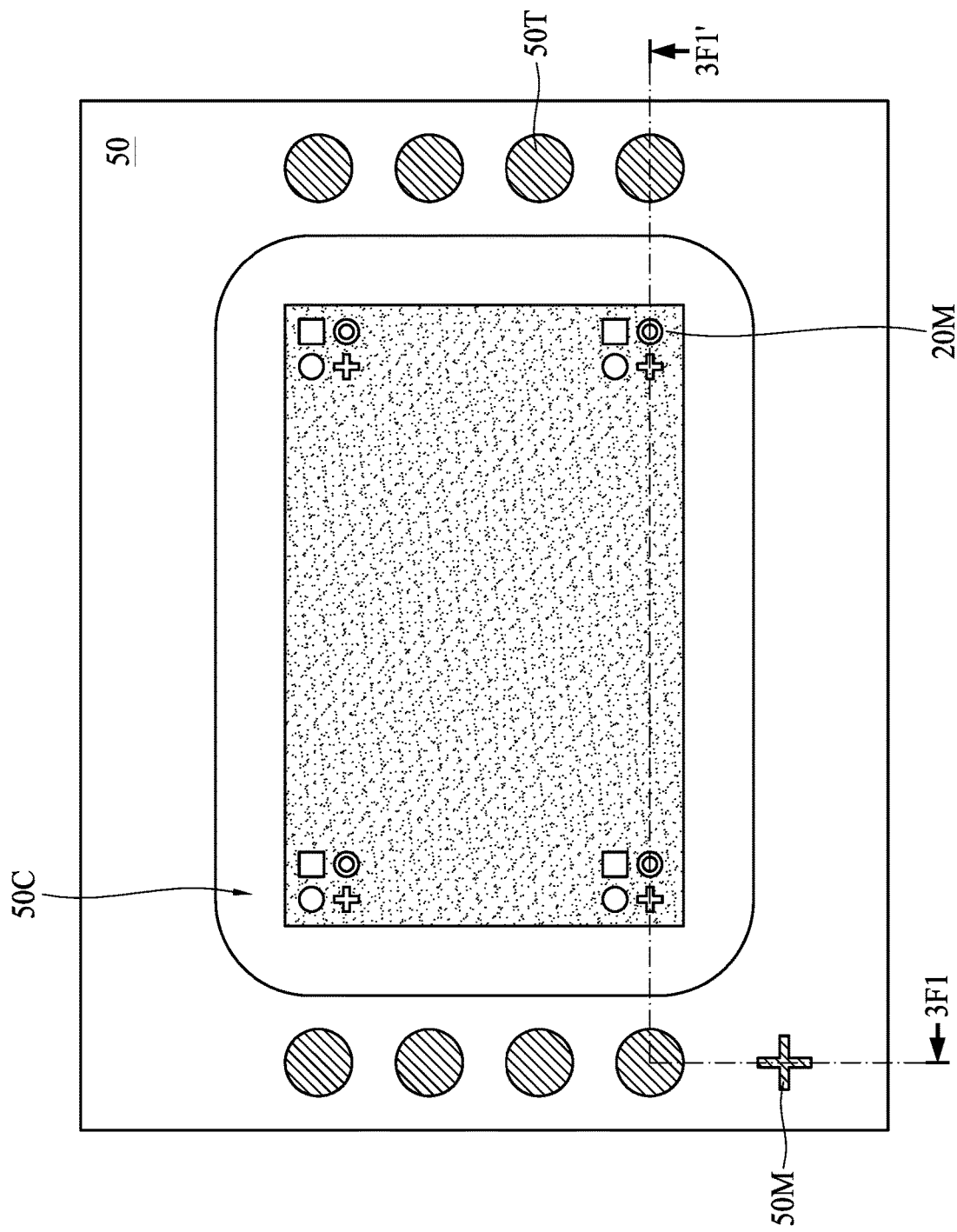

FIG. 3A, FIG. 3B, FIG. 3B1, FIG. 3C, FIG. 3D, FIG. 3E, FIG. 3F, FIG. 3F1, FIG. 3G and FIG. 3H illustrate operations of processing an electronic component in accordance with some embodiments of the present disclosure, where FIG. 3B and FIG. 3F are drawn from top view, and FIG. 3A, FIG. 3B1, FIG. 3C, FIG. 3D, FIG. 3E, FIG. 3F1, FIG. 3G and FIG. 3H are drawn from cross-sectional view. FIG. 3B1 is a cross-sectional view along line 3B1-3B1' of FIG. 3B, and FIG. 3F1 is a cross-sectional view along line 3F1-3F1' of FIG. 3F. Referring to FIG. 3A, a temporary substrate 50 is provided. The temporary substrate 50 includes a first surface 501 and a second surface 502 opposite to the first surface 501. The temporary substrate 50 may be, but is not limited to, a dummy package substrate with circuitry therein, which is the same as the substrate 10. In some embodiments, the temporary substrate 50 may include a plurality of conductive structures 50T such as conductive vias extending from the first surface 501 to the second surface 502. As shown in FIG. 3B and FIG. 3B1, a cavity 50C and a fiducial mark 50M are formed on the first surface 501 of the temporary substrate 50. The cavity 50C may be formed by etching or other suitable processes. The fiducial mark 50M may be formed by patterning layer(s) such as the conductive structures 50T on the temporary substrate 50. In some embodiments, a tape 52 may be attached to the second surface 502 of the temporary substrate 502.

As shown in FIG. 3C, an electronic component 20 or an array of electronic components 20 are disposed in the cavity 50C of the temporary substrate 50, and the electronic component 20 or the array of electronic components 20 may be supported by the tape 52. In some embodiments, the electronic component 20 includes a magnetic layer 22 and a plurality of conductive wires 24 in the magnetic layer 22. In some embodiments, the location of the electronic component 20 in the cavity 50C may be determined by aligning one or more edges 20E of the electronic component 20 with respect to the temporary substrate 50. By way of examples, the location of the electronic component 20 in the cavity 50C may be determined by aligning the one or more edges 20E of the electronic component 20 with respect to a respective edge 50E of the cavity 50C the temporary substrate 50. Additionally or alternatively, the location of the electronic component 20 in the cavity 50C may be determined by aligning the one or more edges 20E of the electronic component 20 with respect to the fiducial mark 50M of the temporary substrate 50.

As shown in FIG. 3D, a passivation layer 20A (also referred to a first passivation layer or a first layer) is formed in the cavity 50C and covers an upper surface 22U of the magnetic layer 22. In some embodiments, the passivation layer 20A is opaque, and the magnetic layer 22 is blocked by the passivation layer 20A. The passivation layer A further covers the fiducial mark 50M, and the fiducial mark 50M is optically recognizable through the passivation layer 20A.

As shown in FIG. 3E, the tape 52 can be removed from the temporary substrate 50, and another passivation layer 20C (also referred to a second passivation layer) can be formed on the second surface 502 of the temporary substrate 50 and on a lower surface 22L of the magnetic layer 22.

As shown in FIG. 3F and FIG. 3F1, a reference alignment mark 20M is formed in the passivation layer 20A. In some embodiments, a location of the reference alignment mark 20M in the passivation layer 20A is determined using the fiducial mark 50M of the temporary substrate 50 because the magnetic layer 22 cannot be observed. In some embodiments, the reference alignment mark 20M may be formed by removing a portion of the passivation layer 20A to form indentation(s) 20AR. The indentation 20AR may, but is not limited to, be formed in a mechanical manner such as by mechanical cutting so as to alleviate crater issue due to melting of the magnetic layer 22. The indentation 20AR exposes the magnetic layer 22, and thus forms the reference alignment mark 20M having a first region (e.g. the passivation layer 20A) and a second region (e.g. the magnetic layer 22 exposed through the indentation 20AR) having distinct optical recognition rates. In some embodiments, the depth of the indentation 20AR may be substantially the same as the thickness of the passivation layer 20A as shown on the left of FIG. 3F1. In some other embodiments, the depth of the indentation 20AR may be larger than the thickness of the passivation layer 20A as shown on the right of FIG. 3F1.

Figure 3G:
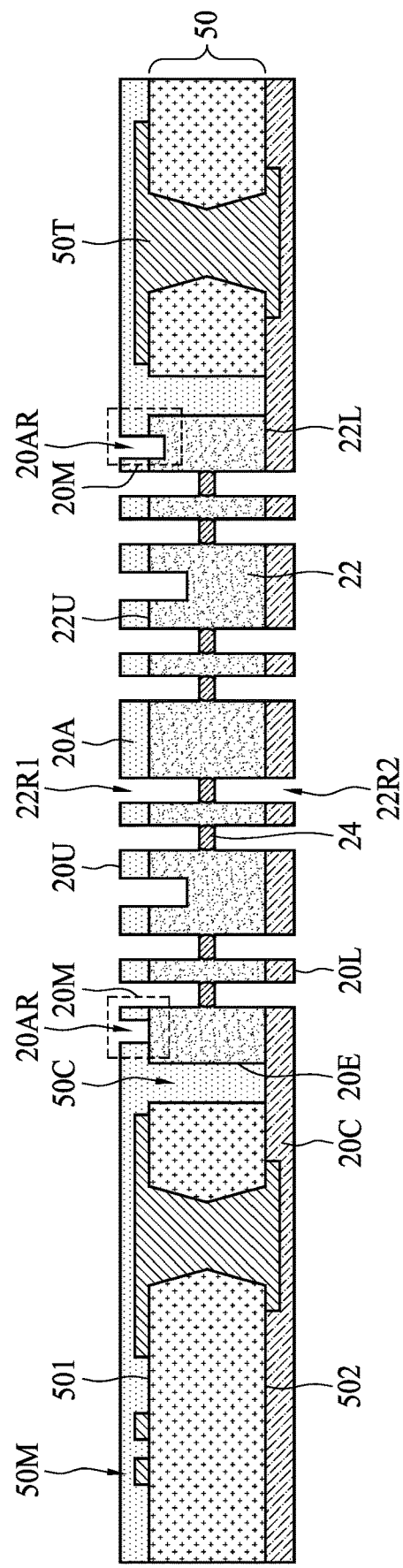

As shown in FIG. 3G, first recesses 22R1 are formed in the passivation layer 20A and the magnetic layer 22 using the fiducial mark 50M of the temporary substrate 50 as an alignment mark. In some embodiments, a portion of the first recesses 22R1 exposes the conductive wires 24, and another portion of the first recesses 22R1 are formed between adjacent conductive wires 24. The exposed portion of the conductive wires 24 may be configured as connection region. Because the magnetic layer 22 is covered and protected by the passivation layer 20A, crater issue is no longer considered. The first recesses 22R1 may be formed in a mechanical manner such as by mechanical cutting or in an optical manner such as by laser cutting. In some embodiments, second recesses 22R2 may be further formed in the passivation layer 20C and in the magnetic layer 22. Similarly, the second recesses 22R2 may be formed in a mechanical manner such as by mechanical cutting or in an optical manner such as by laser cutting.

Figure 3H:
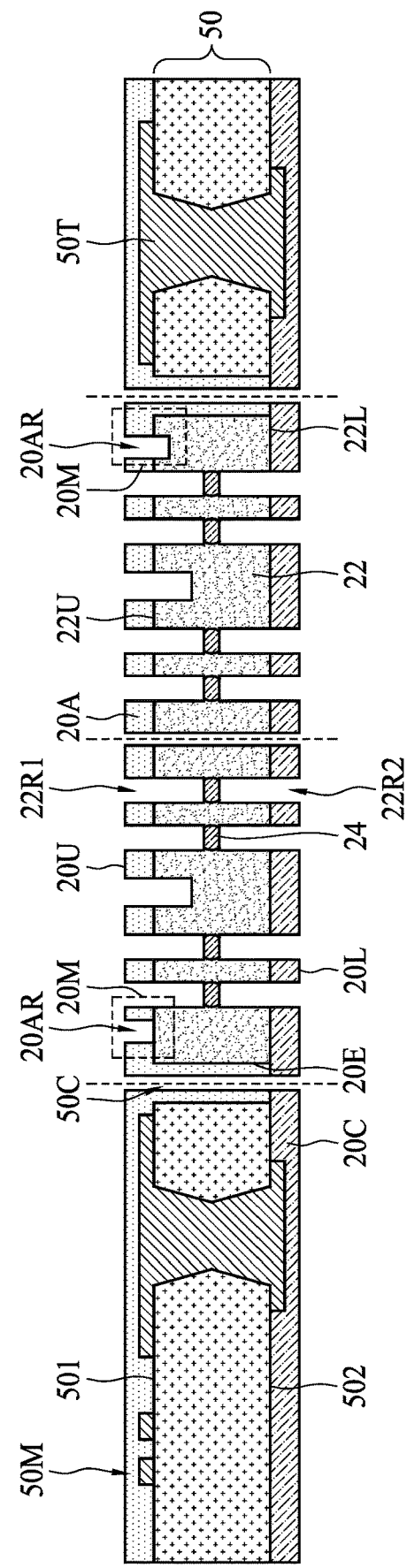

As shown in FIG. 3H, in case an electronic component 20 is disposed in the cavity 50C, the electronic component 20 may be separated from the temporary substrate 50 by cutting off the passivation layer 20A. In case an array of electronic components 20 are disposed in the cavity 50C, the array pf electronic components 20 can be singulated using the fiducial mark 50M (shown in FIG. 3B) of the temporary substrate 50 in addition to separating the electronic component 20 from the temporary substrate 50. In some embodiments, each of the electronic components 50 includes at least one reference alignment mark 20M subsequent to singulation. Accordingly, the electronic component 20 including the passivation layers 20A, 20C, the conductive wires 24 with exposed connection regions and the reference alignment mark 20M is manufactured and ready for package.

Figure 4A:
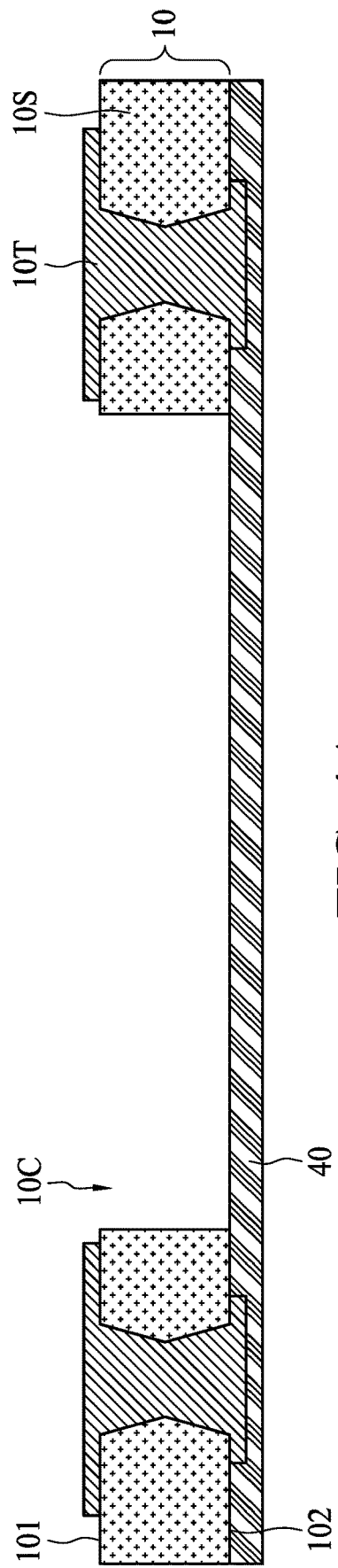
FIG. 4A, FIG. 4B, FIG. 4C, FIG. 4D, FIG. 4E and FIG. 4F illustrate operations of manufacturing a package substrate in accordance with some embodiments of the present disclosure.

FIG. 4A, FIG. 4B, FIG. 4C, FIG. 4D, FIG. 4E and FIG. 4F illustrate operations of manufacturing a package substrate in accordance with some embodiments of the present disclosure. Referring to FIG. 4A, a substrate 10 is provided. The substrate 10 includes a first surface 101 and a second surface 102 opposite to the first surface 101. The substrate 10 may include a package substrate with circuitry therein. For example, the substrate 10 may include a core substrate, a core-less substrate or other types of substrates. The substrate 10 may include a plurality of conductive structures 10T such as conductive vias extending from the first surface 101 to the second surface 102 of the substrate 10 to electrically connect electronic components and/or semiconductor die disposed on the first surface 101 and the second surface 102. For example, the conductive structures 10T may include copper or other suitable conductive material. In some embodiments, the cross-sectional shape of the conductive structure 10T may include, but is not limited to, an X shape or an hourglass shape. In some other embodiments, the cross-sectional shape of the conductive structure 10T may include rectangular shape, trapezoid shape or other suitable shapes. A cavity 10C is formed in the substrate 10. The cavity 10C may be formed by etching or other suitable processes. In some embodiments, a fiducial mark 10M is formed on the first surface 101 of the substrate 10. In some embodiments, a tape 40 is adhered to the second surface 102 of the substrate 10 to seal the cavity 10C.

Figure 4B:
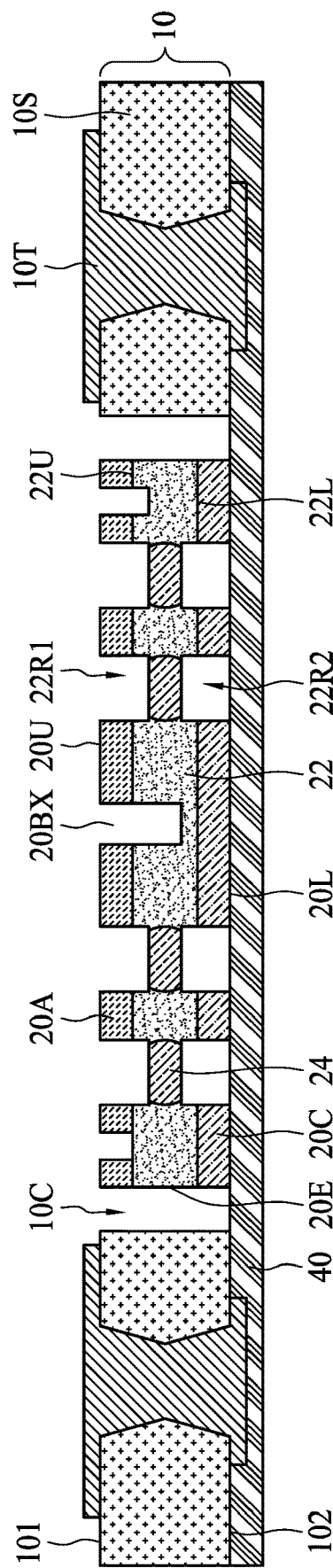

As shown in FIG. 4B, at least one electronic component 20 including a reference alignment mark 20M is provided. The electronic component 20 can, but is not limited to, be manufactured by the aforementioned method. The electronic component 20 is disposed in the cavity 10C of the substrate 10, and supported by the tape 40. Because the electronic component 20 has the reference alignment mark 20M formed thereon, the location of the electronic component 20 in the cavity 10C can be determined by aligning the reference alignment mark 20M of the electronic component 20 with the substrate 10. By way of example, the location of the electronic component 20 in the cavity 10C is determined by aligning the reference alignment mark 20M of the electronic component 20 with the fiducial mark 10M of the substrate 10.

Figure 4C:
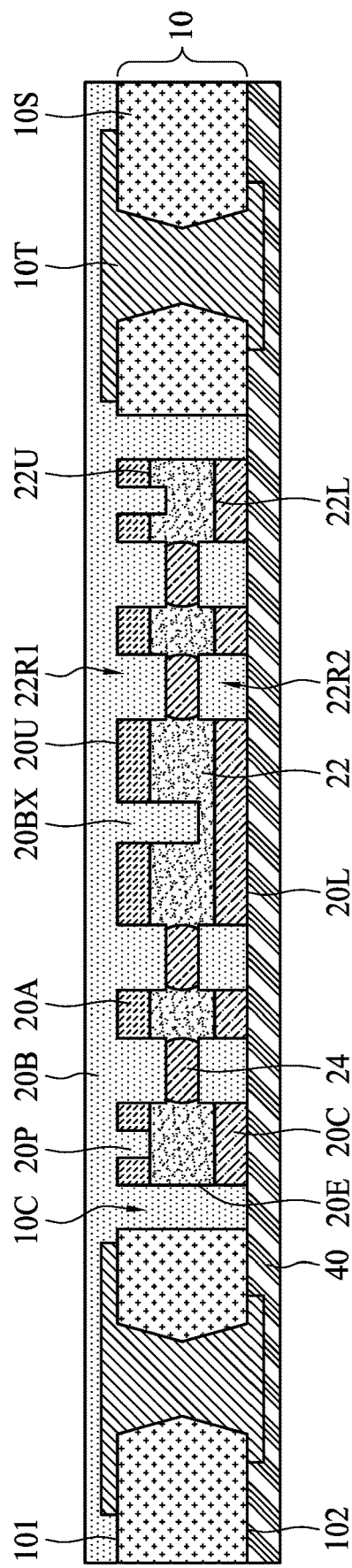
Figure 4D:
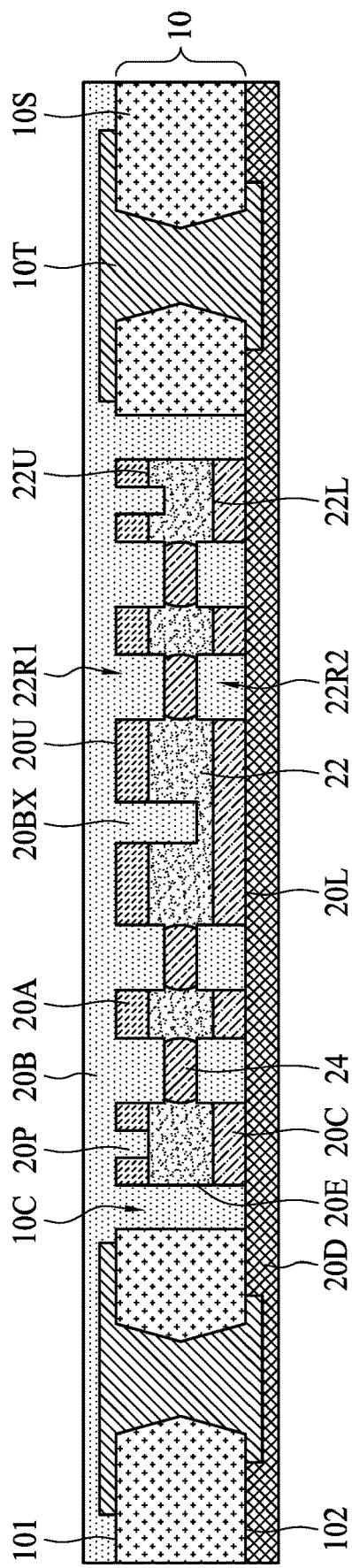

As shown in FIG. 4C, a dielectric layer 20B is formed in the cavity 10C and covers a first surface 20U of the electronic component 20. The dielectric layer 20B may fill in the first recesses 22R1 and the second recesses 22R2. As shown in FIG. 4D, the tape 40 is removed from the second surface 102 of the substrate 10. Another dielectric layer 20D is formed on the second surface 102 of the substrate 10, and covers a second surface 20U of the electronic component 20.

Figure 4E:
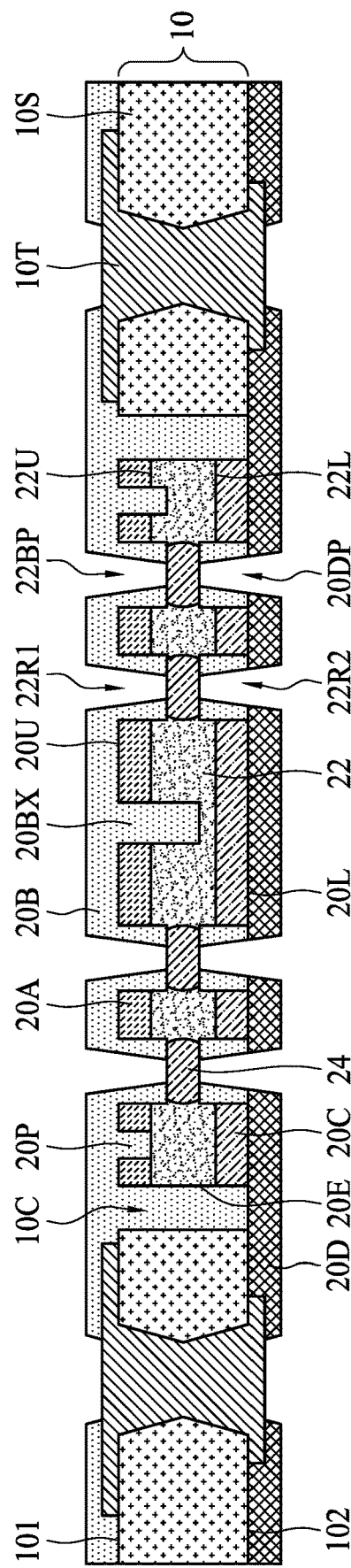

As shown in FIG. 4E, a plurality of first perforations 20BP are formed in the dielectric layer 20B to partially expose conductive wires 24 of the electronic component 20. In some embodiments, the first perforations 20BP may be, but is not limited to, formed in an optical manner, for example by laser drilling. The first perforations 20BP may include, but is not limited to, an inclined sidewall profile. The locations of the first perforations 20BP can be accurately aligned using the reference alignment mark 20M and/or the fiducial mark 10M of the substrate 10. In some embodiments, a plurality of second perforations 20DP are formed in the dielectric layer 20D and to partially expose the conductive wires 24 of the electronic component 20. The second perforations 20DP may be, but is not limited to, formed in an optical manner, for example by laser drilling. The second perforations 20DP may include, but is not limited to, an inclined sidewall profile.

Figure 4F:
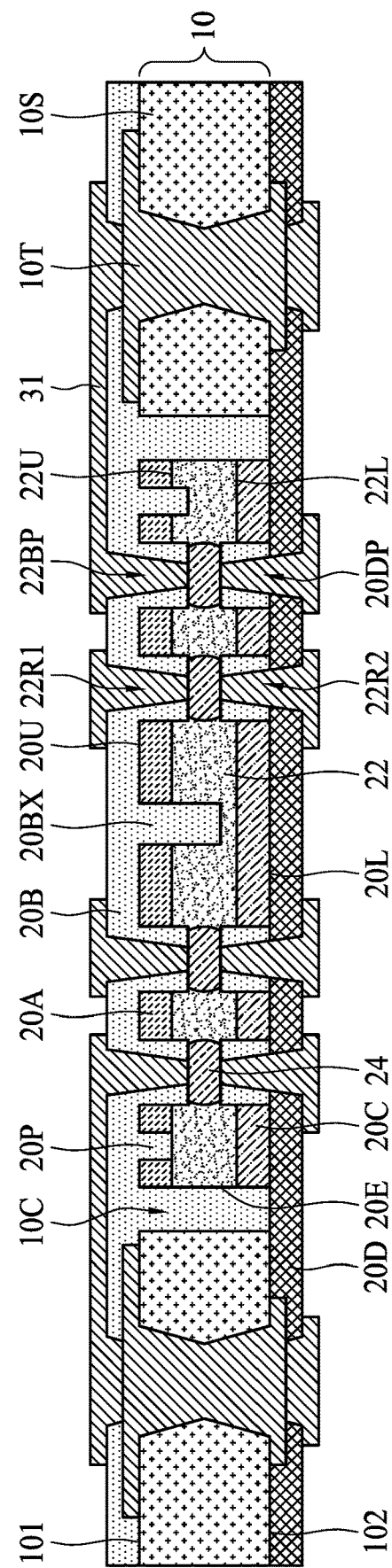

As shown in FIG. 4F, a plurality of first conductive traces 31 are formed in the first perforations 20BP to electrically connect the conductive wires 24 exposed through the first perforations 20BP. In some embodiments, a seed layer may be formed on the dielectric layer 20B, and the first conductive traces 31 may be formed by e.g., electroplating, but is not limited thereto. In some embodiments, some of the conductive structures 10T may be electrically connected to the first conductive traces 31. In some other embodiments, some of the conductive structures 10T may be electrically disconnected from the first conductive traces 31. In some embodiments, a plurality of second conductive traces 32 are formed in the second perforations 20DP to electrically connect the conductive wires 24 exposed through the second perforations 20DP. In some embodiments, a seed layer may be formed on the dielectric layer 20D, and the second conductive traces 32 may be formed by e.g., electroplating, but is not limited thereto. In some embodiments, some of the conductive structures 10T may be electrically connected to the second conductive traces 32. In some other embodiments, some of the conductive structures 10T may be electrically disconnected from the second conductive traces 32.

In some embodiments of the present disclosure, the package substrate includes an electronic component embedded in the cavity of the substrate, and thus the overall thickness of the package substrate can be reduced. The electronic component includes a pre-formed visible reference alignment mark, and thus the electronic component can be aligned with respect to the substrate.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A package substrate, comprising:
   a substrate including a cavity; and
   an electronic component disposed in the cavity, wherein the electronic component includes a first region and a second region, and an optical recognition rate of the first region is distinct from that of the second region;
   wherein the electronic component comprises a magnetic layer and a conductive wire in the magnetic layer,
   wherein the electronic component comprises a stack of a passivation layer and a dielectric layer, and the passivation layer is between the dielectric layer and the magnetic layer.

2. The package substrate of claim 1, wherein the dielectric layer includes a protrusion inserted into the passivation layer to form the first region and the second region.

3. The package substrate of claim 2, wherein a bottom surface of the protrusion is at an elevation lower than an upper surface of the magnetic layer with respect to the conductive wire.

4. The package substrate of claim 1, wherein an interface between the magnetic layer and the conductive wire is curved.

5. The package substrate of claim 1, wherein the electronic component comprises a stack of a first layer and a second layer, and wherein the first layer is between the second layer and the magnetic layer.

6. The package substrate of claim 5, wherein the second layer includes a protrusion inserted into the first layer to form the first region and the second region.

7. The package substrate of claim 1, wherein an area of the second region is small than an area of the first region.

8. The package substrate of claim 1, further comprising a first layer and a second layer disposed over the electronic component, wherein the first layer and the second layer collectively form the first region and the second region from a top view.

9. The package substrate of claim 8, wherein the second layer is surrounded by the first layer to collectively form the second region.

10. The package substrate of claim 8, wherein the second layer is disposed over the first layer, wherein the second layer has a first thickness at the first region and a second thickness at the second region, and wherein the first thickness is different from the second thickness.

11. The package substrate of claim 1, wherein the conductive wire is exposed from a first layer disposed over the magnetic layer.

12. The package substrate of claim 11, wherein the conductive wire is exposed from a second layer disposed over the magnetic layer.

13. The package substrate of claim 1, further comprising: a conductive trace arranged and extending over the substrate and the electronic component, wherein the conductive trace extends into the magnetic layer and establishes an electrical contact with the conductive wire.

14. The package substrate of claim 1, wherein the magnetic layer has a first opening exposing a part of an upper surface of the conductive wire.

15. The package substrate of claim 14, wherein a width of the part of the upper surface of the conductive wire exposed from the magnetic layer is greater than a thickness of the conductive wire.

16. The package substrate of claim 14, wherein from a cross-sectional view, a lateral surface of the conductive wire is curved.

17. The package substrate of claim 16, wherein from a cross-sectional view, the conductive wire tappers downwardly.

18. The package substrate of claim 14, wherein the magnetic layer has a second opening, and a depth of the first opening and a depth of the second opening are different.

19. The package substrate of claim 18, wherein a width of the first opening and a width of the second opening are different.

\* \* \* \* \*